United States Patent

Vogel et al.

[11] Patent Number: 5,710,463
[45] Date of Patent: Jan. 20, 1998

[54] HIGH-VOLTAGE BREAKOVER DIODE

[75] Inventors: Manfred Vogel, Lerchenstr.; Johann Konrad, Eckenerstr.; Werner Herden, Kappelweg; Richard Spitz, Roemersteinstr.; Herbert Goebel, Spitzaeckerweg, all of Germany

[73] Assignee: Robert Bosch GmbH, Stuttgart, Germany

[21] Appl. No.: 581,585

[22] PCT Filed: May 10, 1995

[86] PCT No.: PCT/DE95/00615

§ 371 Date: Jan. 17, 1996

§ 102(e) Date: Jan. 17, 1996

[87] PCT Pub. No.: WO95/31827

PCT Pub. Date: Nov. 23, 1995

[30] Foreign Application Priority Data

May 17, 1994 [DE] Germany ............... 44 17 164.1

[51] Int. Cl.⁶ ................................................. H01L 23/48
[52] U.S. Cl. ........................ 257/777; 257/724; 257/792; 257/113
[58] Field of Search ............... 257/96, 113, 723, 257/724, 777, 783, 792, 725

[56] References Cited

U.S. PATENT DOCUMENTS

| | | | |
|---|---|---|---|
| 3,363,150 | 1/1968 | Whitman et al. | 257/724 |
| 3,373,335 | 3/1968 | Rosenberg | 363/68 |
| 3,416,046 | 12/1968 | Dickson, Jr. et al. | 257/724 |
| 4,535,350 | 8/1985 | Goodrich et al. | 257/783 |
| 4,989,063 | 1/1991 | Kolesar, Jr. | 257/792 |
| 5,245,412 | 9/1993 | Clark et al. | 257/723 |

FOREIGN PATENT DOCUMENTS

| | | |
|---|---|---|
| 40 32 131 | 4/1992 | Germany. |
| WO 88/00395 | 1/1988 | WIPO. |
| WO 89/11734 | 11/1989 | WIPO. |

Primary Examiner—Jerome Jackson
Assistant Examiner—Nathan K. Kelly
Attorney, Agent, or Firm—Kenyon & Kenyon

[57] ABSTRACT

A high-voltage breakover diode is proposed, which takes on the function of an ignition voltage distributor of an internal combustion engine having solid-state highvoltage distribution. The high-voltage breakover diode comprises a cascade of breakover diode chips, a polyimide layer having recesses in the region of the cathode connection being provided between the individual breakover diode chips produced using planar technology, in each case on the top of the breakover diode chips, and the mechanical and electrical connection of the individual breakover diode chips being effected by means of a conductive adhesive (FIG. 3).

9 Claims, 3 Drawing Sheets

HIGH-VOLTAGE BREAKOVER DIODE

BACKGROUND OF THE INVENTION

A high-voltage breakover diode is described in German Patent Application No. DE 40 32 131, in which a multiplicity of series-connected breakover diodes constitute a high-voltage breakover diode. In this case, the individual semiconductor elements are stacked one above the other in a cascade circuit and the periphery of this semiconductor stack is subsequently covered with a translucent insulator. High voltages can be switched with great precision by means of such a high-voltage breakover diode, with the result that this high-voltage breakover diode can be used as an ignition voltage distributor for solid-state high-voltage distribution. In this case, the pn junctions situated at the periphery of the cascade form light-sensitive zones, which are driven by light-emitting elements in such a way that they switch through at a predetermined point in time.

SUMMARY OF THE INVENTION

The arrangement according to the present invention has the advantage that conventional breakover diode chips produced using planar technology can be used for the production of the breakover diode cascade. Moreover, this arrangement has the advantage that the pn junctions with a high blocking capacity are not exposed at the periphery of the breakover diode stack but are passivated with silicon oxide ($SiO_2$) on the top of the chips and, consequently, it is not possible for undesired switching of the breakover diode to take place due to undefined surface conditions at the edge, which may result from sawing damage, as a result of which a high yield from the silicon wafer and a high switching accuracy of each breakover diode chip are provided. The insulation between the breakover diode chips by means of an electrically insulating plastic layer and the mechanical connection and electrical contact-making by means of a connecting layer provide additional mechanical strength, even with a small cathode surface area. It is thus possible to use breakover diode chips having a small chip surface area, resulting in lower chip costs, and at the same time to ensure a high mechanical strength.

It is particularly advantageous that the electrically insulating plastic layer can be photopatterned, and that it can be applied using the screen printing process and the necessary recesses in the region of the electrodes and of the sawing trenches can subsequently be produced by photolithography. Moreover, it is advantageous to use a polyimide layer as the electrically insulating plastic layer. It is thus possible to ensure the conduction of light from the periphery of the high-voltage breakover diode to the light-sensitive pn junctions, which are in each case exposed on the top of the breakover diode chips.

It is further advantageous that, for the production of a high-voltage breakover diode, a silicon wafer having a multiplicity of individual breakover diodes can firstly be produced and then individual wafers are stacked one above the other to form a stack, with the result that the high-voltage breakover diode can be produced very cost-effectively and easily by simply sawing it out.

Furthermore, it is advantageous to produce the mechanical connection and to make electrical contact between the individual breakover diode wafers by means of a conductive adhesive, for example a polyimide adhesive containing metal, it being advantageous to use a precurable adhesive since this can be applied using the screen printing process and is precured for better handling, with the result that this adhesive only has to be cured after the connection of the individual breakover diode chips.

Finally, a soldered connection can also be provided for the mechanical and electrical connection of the individual breakover diode chips, the soldered connection under certain circumstances being more cost-effective than the adhesive.

DETAILED DESCRIPTION

Figure 1:
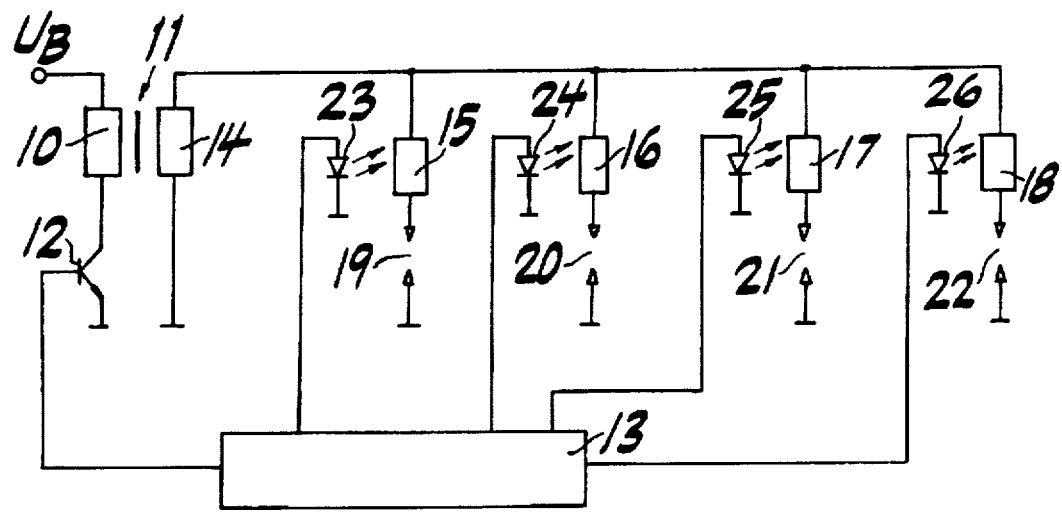
FIG. 1 shows the basic structure of an ignition system using a high-voltage breakover diode.

FIG. 1 illustrates the basic structure of an ignition system using light-controlled high-voltage breakover diodes. A battery voltage $U_B$ is applied to a primary winding 10 of an ignition coil 11, the primary winding 10 being connected at the other end to ground via a switching transistor 12. The switching transistor 12 is continuously actuated, via its base connection, by a control circuit 13 in order to generate a secondary high voltage across the ignition coil 11. For this, for example, the control circuit 13 determines the closing time and the ignition instant for the ignition coil on the basis of operating parameters, and the base connection is driven accordingly. However, this is not the subject matter of the present invention and will not be explained in more detail. A secondary winding 14 of the ignition coil 11 is connected at one end to ground and at the other end to the spark plugs 19 to 22 via a respective high-voltage breakover diode 15 to 18. The high-voltage breakover diodes 15 to 18 are produced by cascading individual breakover diode Chips. A respective light-emitting source 23 to 26, for example light-emitting diodes, is assigned to the individual high-voltage breakover diodes. These light-emitting diodes are driven by the controller 13 in accordance with the ignition sequence and in this way pass the ignition voltage on to the spark plugs 19 to 22. It is thus possible to implement solid-state high-voltage distribution, that is to say without a rotating distributor arm, with a single ignition coil 11 as well.

Figure 2:
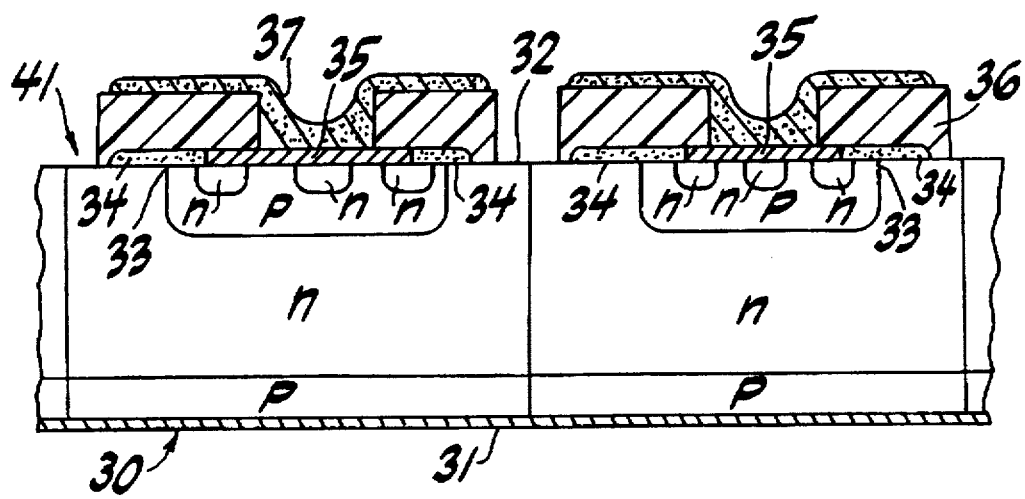
FIG. 2 shows a detail of a structured silicon wafer having individual breakover diodes.

FIG. 2 shows a cross section of the basic structure of breakover diodes which have been produced using planar technology. In this case, a detail is illustrated of two breakover diodes, which are correspondingly produced on a silicon wafer. An individual breakover diode is, for example, a four-layer diode which flips from the reverse state to the forward state when the voltage between the anode and the cathode exceeds a specific value. The breakover diode is consequently a very fast switch, which switches over from the state of high resistance to a state of low resistance in billionths of a second.

The individual breakover diode chip comprises a monocrystalline semiconductor substrate, in particular a silicon wafer, which has a thickness of approximately 50 to 600 micrometers and in which the individual layers (p,n,p,n) are incorporated by the diffusion of dopants. In this case, an anode metallization layer 31 is applied to the underside 30 of the breakover diode chip, in order in this way to be able to produce the electrical connections. The revere pn junction 33, which generally surrounds the cathode/gate region in a ring, is arranged on the top 32 of the breakover diode chip. This pn junction 33 with a high blocking capacity is covered with a silicon oxide layer 34 (SiO₂) for the purpose of insulation. The cathode region is furthermore covered with a cathode metallization layer 35 in order to produce the electrical connection.

When these breakover diode chips are simply stacked one above the other, the cathode metallization layer of the top of the breakover diode chips can be electrically connected to the anode metallization layer of the underside of the breakover diode chips without short-circuiting the silicon oxide insulation 34. For this, according to the present invention, a polyimide layer 36 having a thickness of approximately 10 to 200 micrometers is applied to the top of the breakover diode chips. This polyimide layer 36 may, for example, initially be a closed layer over the entire top 32 of the breakover diode chips, which layer is subsequently opened, for example by means of a photolithographic process, in the region of the cathode connections and of the sawing trenches 41.

A conductive adhesive 37 is now applied, for example, using screen printing technology, all over the top of the breakover diode chips having the polyimide layer. This adhesive could be, for example, a precurable polyimide adhesive containing silver. This precured adhesive enables the individual wafers to be aligned with respect to one another when they are stacked one on top of the other. Once they have been stacked one on top of the other, the adhesive can cure, with the result that the chips are electrically connected and high-voltage breakover diodes are produced which are connected over the whole area and are therefore mechanically strong.

A multiplicity of individual high-voltage breakover diodes can now advantageously be produced from the wafer stack by separation along the sawing trenches in the vertical direction. Finally, the cathode or anode which is respectively exposed at the end of the stack is provided with an end wire and the entire high-voltage breakover diode is surrounded by translucent plastic encapsulation.

Figure 3:
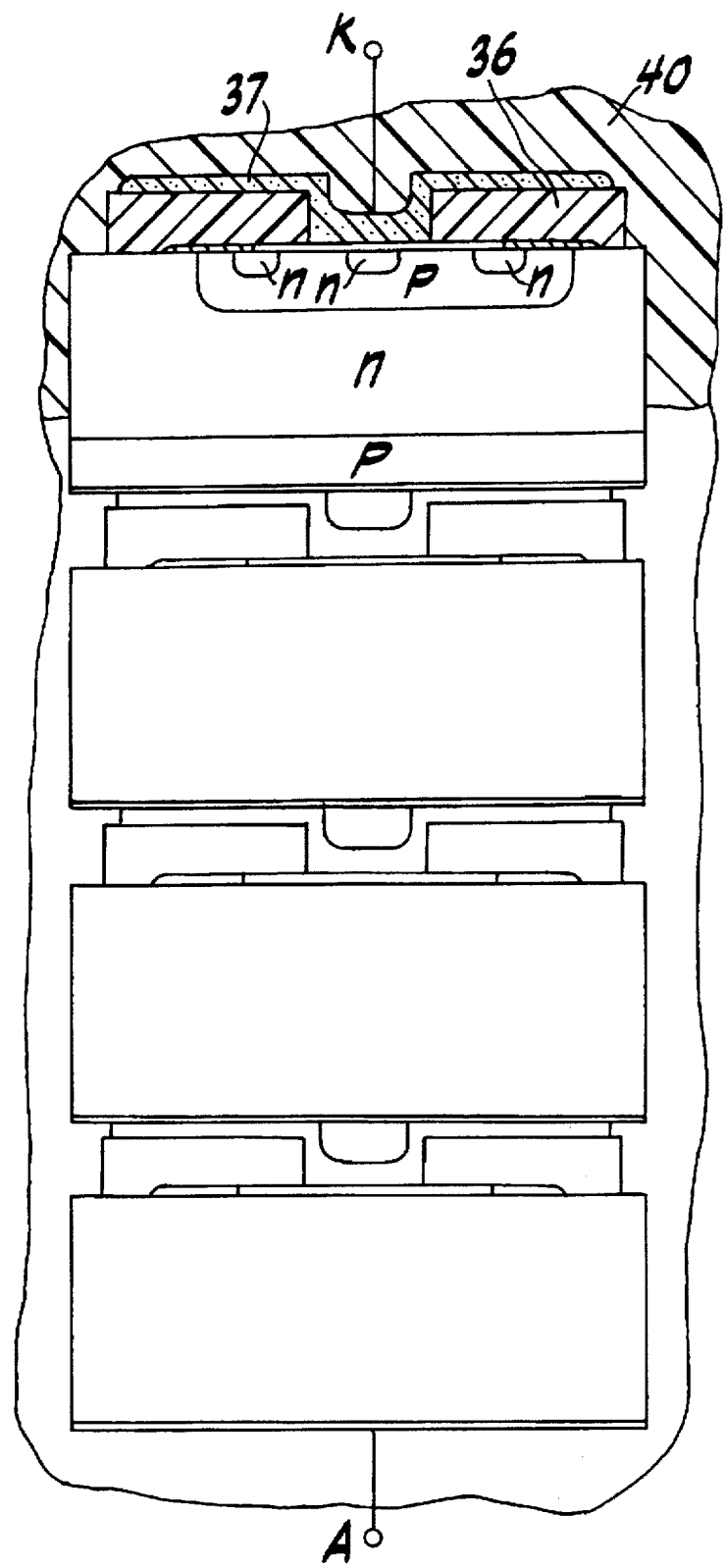
FIG. 3 shows the stacking of the individual breakover diodes according to FIG. 2 with an adhesive connection.

FIG. 3 shows the stacking of the individual breakover diode chips one above the other to form a high-voltage breakover diode with the use of a conductive adhesive for producing the mechanical connection and electrical contact-making between the individual breakover diode chips. The end wires which are fitted to the top and underside and are used for producing the cathode connection and anode connection are clearly evident. The transparent plastic encapsulation 40 of the entire highvoltage breakover diode is also indicated.

Figure 4:
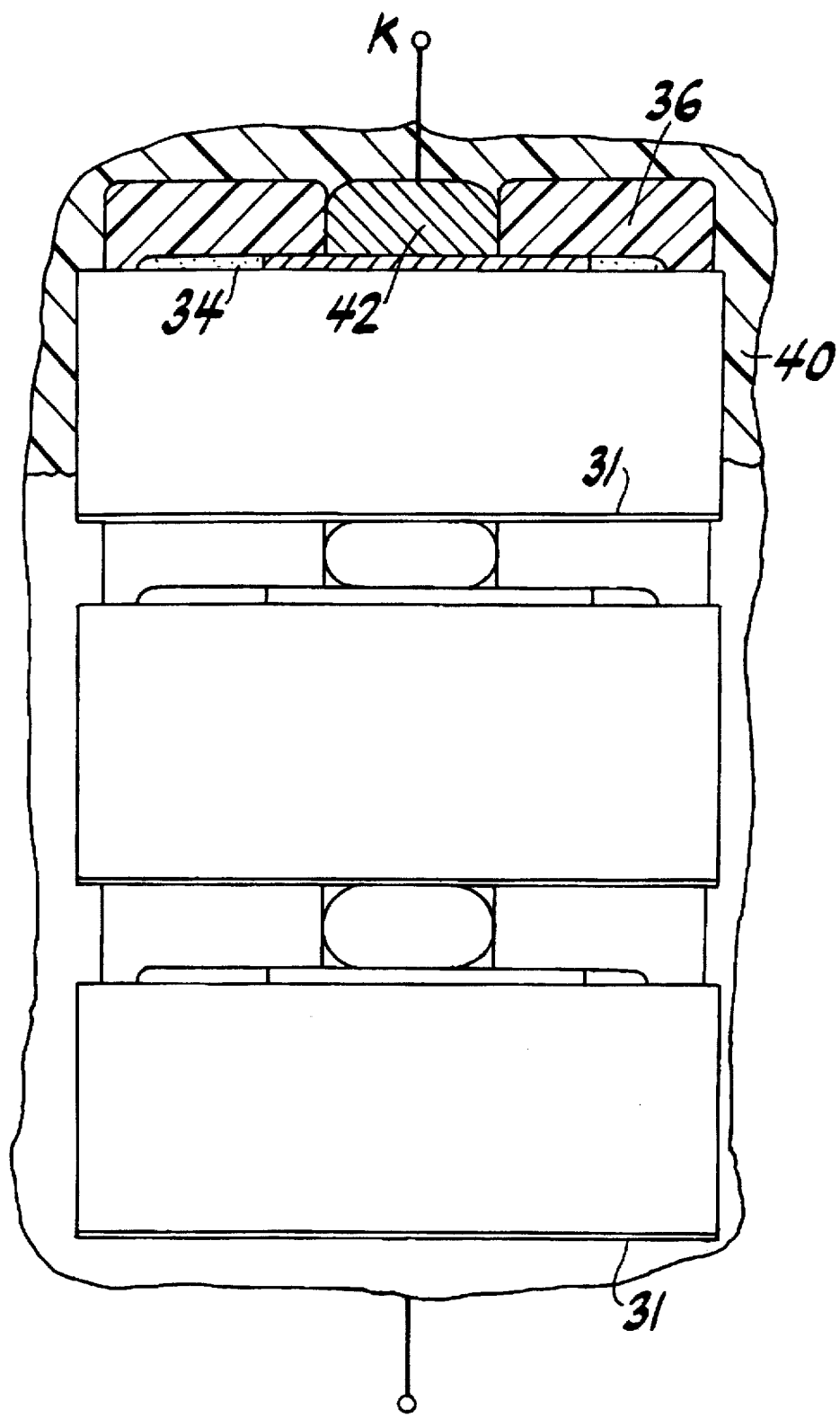
FIG. 4 shows the stacking with a soldered connection.

FIG. 4 shows a high-voltage breakover diode, the connecting layer being implemented as a soldered connection 42, it being possible to use both soft solder and a silver solder in this case. The rest of the structure of the high-voltage breakover diode corresponds to the structure which has already been described with regard to FIGS. 2 and 3, so that it is not explained again here.

We claim:

1. A high-voltage breakover diode comprising:

a plurality of series-connected breakover diode chips, each of the breakover diode chips having a p-n junction covered by an insulation layer, each of the p-n junctions and each of the insulation layers being disposed on a top side of a corresponding one of the breakover diode chips, the breakover diode chips being produced using planar technology;

a first electrode disposed on the top side of each of the breakover diode chips;

a first electrically conductive layer covering each of the first electrodes;

a second electrode disposed on a bottom side of each of the breakover diode chips;

a second electrically conductive layer covering each of the second electrodes;

an electrically insulating plastic layer disposed on the top side of each of the breakover diode chips, each of the electrically insulating plastic layers having a recess in a region of the first electrodes; and a connecting layer for electrically and mechanically coupling the breakover diode chips.

2. The diode according to claim 1, wherein each of the electrically insulating plastic layers is photopatterned.

3. The diode according to claim 1, wherein each of the electrically insulating plastic layers includes a polyimide layer.

4. The diode according to claim 3, wherein each of the polyimide layers has a thickness between 10 and 200 μm.

5. The diode according to claim 1, wherein the connecting layer includes a conductive adhesive.

6. The diode according to claim 5, wherein the adhesive is precurable.

7. The diode according to claim 5, wherein the adhesive includes a polyimide adhesive containing a metal.

8. The diode according to claim 5, wherein the adhesive is screen-printed as a thick film.

9. The diode according to claim 1, wherein the connecting layer includes a soldered connection.

* * * * *